(12) United States Patent
Lee

(10) Patent No.: US 11,476,276 B2
(45) Date of Patent: Oct. 18, 2022

(54) SEMICONDUCTOR DEVICE AND METHOD FOR FABRICATING THE SAME

(71) Applicant: MACRONIX INTERNATIONAL CO., LTD., Hsinchu (TW)

(72) Inventor: Guan-Ru Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 221 days.

(21) Appl. No.: 17/102,563

(22) Filed: Nov. 24, 2020

(65) Prior Publication Data

US 2022/0165746 A1 May 26, 2022

(51) Int. Cl.
*H01L 27/1158* (2017.01)
*H01L 27/11582* (2017.01)
(Continued)

(52) U.S. Cl.
CPC .. *H01L 27/11582* (2013.01); *H01L 21/76802* (2013.01); *H01L 23/5226* (2013.01); *H01L 27/11565* (2013.01)

(58) Field of Classification Search
CPC .......... H01L 27/11273–1128; H01L 27/11514; H01L 27/11551; H01L 27/11556; H01L 27/11578–11582; H01L 27/11597; H01L 27/2481–249; H01L 27/11582; H01L 27/11565; H01L 21/76802; H01L 23/5226; H01L 29/7926; H01L 29/66833; H01L 27/1157; H01L 27/1021; H01L 29/66712; H01L 29/7802; H01L 29/66734; H01L 29/7813; H01L 21/823462; H01L 21/823857; H01L 2029/7858; H01L 21/28282; H01L 21/823431; H01L 21/823821; H01L 21/845; H01L 27/0886; H01L 27/0924; H01L 27/10826; H01L 27/10879; H01L 27/1211; H01L 29/41791;
(Continued)

(56) References Cited

U.S. PATENT DOCUMENTS 7,696,559 B2 * 4/2010 Arai .................. H01L 29/66833
257/315
7,982,260 B2 * 7/2011 Fukuzumi ............. H01L 29/792
257/329

(Continued)

*Primary Examiner* — Mary A Wilczewski
*Assistant Examiner* — Tsz K Chiu
(74) *Attorney, Agent, or Firm* — McClure, Qualey & Rodack, LLP

(57) ABSTRACT

A semiconductor device includes a stack and a plurality of memory strings. The stack is formed on a substrate, and the stack includes conductive layers and insulating layers alternately stacked. The memory strings penetrate the stack along a first direction. Each of the memory strings includes a first conductive pillar, a second conductive pillar, a channel layer and a memory structure. The first conductive pillar and the second conductive pillar extend along the first direction, respectively, and electrically isolated to each other. The channel layer extends along the first direction. The channel layer is disposed between the first conductive pillar and the second conductive pillar, and the channel layer is coupled to the first conductive pillar and the second conductive pillar. The memory structure surrounds the first conductive pillar, the second conductive pillar and the channel layer.

20 Claims, 15 Drawing Sheets

(51) Int. Cl.
*H01L 27/11565* (2017.01)
*H01L 21/768* (2006.01)
*H01L 23/522* (2006.01)

(58) Field of Classification Search
CPC ............. H01L 29/66795; H01L 29/785; H01L 29/792; H01L 2924/13067; H01L 29/7808; H01L 27/11517; H01L 29/788; H01L 29/42324; H01L 29/66825; H01L 2924/13081; H01L 2924/13085; H01L 29/6684; H01L 29/78391; H01L 29/4236
See application file for complete search history.

(56) References Cited

U.S. PATENT DOCUMENTS

| | | | | |
|---|---|---|---|---|
| 8,030,700 | B2* | 10/2011 | Sakamoto | H01L 27/11578 257/306 |
| 8,072,024 | B2* | 12/2011 | Ishikawa | H01L 27/11582 438/386 |
| 8,211,811 | B2* | 7/2012 | Matsushita | H01L 29/66833 438/763 |
| 8,236,673 | B2* | 8/2012 | Son | H01L 29/7926 438/259 |
| 8,338,876 | B2* | 12/2012 | Kito | H01L 29/7926 257/314 |
| 8,349,681 | B2* | 1/2013 | Alsmeier | H01L 29/66825 257/E21.309 |
| 8,415,242 | B2* | 4/2013 | Mizushima | H01L 29/7926 257/E21.409 |
| 8,552,489 | B2* | 10/2013 | Eom | H01L 29/4234 257/E21.21 |
| 8,658,499 | B2* | 2/2014 | Makala | H01L 29/40117 257/334 |
| 8,829,595 | B2* | 9/2014 | Lee | H01L 27/11582 257/E21.21 |
| 8,928,061 | B2* | 1/2015 | Chien | H01L 21/32053 257/315 |
| 8,994,091 | B2* | 3/2015 | Lee | H01L 29/7926 257/316 |
| 9,018,682 | B2* | 4/2015 | Izumida | H01L 27/11582 257/234 |
| 9,076,879 | B2* | 7/2015 | Yoo | H01L 29/7926 |
| 9,099,496 | B2* | 8/2015 | Tian | H01L 29/7889 |
| 9,159,739 | B2* | 10/2015 | Makala | H01L 27/11556 |
| 9,219,070 | B2* | 12/2015 | Thimmegowda | H01L 27/0207 |
| 9,219,073 | B2* | 12/2015 | Chen | H01L 27/1157 |
| 9,236,396 | B1* | 1/2016 | Koka | H01L 29/517 |
| 9,263,462 | B2* | 2/2016 | Eom | H01L 27/11565 |
| 9,305,849 | B1* | 4/2016 | Tsutsumi | H01L 27/1157 |
| 9,312,008 | B2* | 4/2016 | Nam | G11C 16/3459 |
| 9,406,694 | B1* | 8/2016 | Ikeno | H01L 29/66833 |
| 9,634,024 | B2* | 4/2017 | Kanamori | H01L 27/1157 |
| 9,659,958 | B2* | 5/2017 | Lee | H01L 27/11582 |
| 10,068,917 | B2* | 9/2018 | Kanamori | H01L 27/11582 |
| 10,141,326 | B1* | 11/2018 | Oh | H01L 23/5226 |
| 10,243,000 | B2* | 3/2019 | Sohn | H01L 27/11556 |
| 10,276,583 | B2* | 4/2019 | Sharangpani | H01L 27/0688 |
| 10,340,286 | B2* | 7/2019 | Goda | H01L 27/11582 |
| 10,490,567 | B2* | 11/2019 | Choi | H01L 29/1037 |
| 10,566,346 | B2* | 2/2020 | Lee | H01L 27/11568 |
| 10,910,402 | B1* | 2/2021 | Hu | H01L 27/11573 |
| 11,037,947 | B2* | 6/2021 | Lai | H01L 23/535 |
| 11,133,329 | B2* | 9/2021 | Lue | G11C 7/18 |
| 2008/0173928 | A1* | 7/2008 | Arai | H01L 29/7926 257/E21.409 |
| 2009/0097321 | A1* | 4/2009 | Kim | H01L 29/42344 438/257 |
| 2009/0296476 | A1* | 12/2009 | Shin | H01L 27/11578 438/109 |
| 2010/0019310 | A1* | 1/2010 | Sakamoto | H01L 29/792 257/324 |
| 2010/0038699 | A1* | 2/2010 | Katsumata | H01L 29/66833 257/E21.409 |
| 2010/0202206 | A1* | 8/2010 | Seol | H01L 23/528 365/185.17 |
| 2010/0320528 | A1* | 12/2010 | Jeong | H01L 27/105 257/E27.098 |
| 2012/0012920 | A1* | 1/2012 | Shin | H01L 29/4234 257/E29.262 |
| 2012/0091521 | A1* | 4/2012 | Goda | H01L 29/66666 257/E29.17 |
| 2012/0098050 | A1* | 4/2012 | Shim | H01L 27/11578 257/E29.262 |
| 2012/0140562 | A1* | 6/2012 | Choe | H01L 27/1157 257/329 |
| 2012/0211820 | A1* | 8/2012 | Komori | H01L 29/7926 257/E21.21 |
| 2012/0267702 | A1* | 10/2012 | Jee | H01L 27/11582 257/E21.423 |
| 2013/0134492 | A1* | 5/2013 | Yang | H01L 27/11582 257/314 |
| 2013/0134493 | A1* | 5/2013 | Eom | H01L 27/11582 257/314 |
| 2013/0270643 | A1* | 10/2013 | Lee | H01L 27/1052 257/365 |
| 2014/0203442 | A1* | 7/2014 | Yun | H01L 27/11548 257/773 |
| 2014/0326939 | A1* | 11/2014 | Yamato | H01L 45/1233 257/2 |
| 2015/0104916 | A1* | 4/2015 | Lee | H01L 27/1157 438/268 |
| 2015/0155297 | A1* | 6/2015 | Eom | H01L 29/7926 438/268 |
| 2015/0206896 | A1* | 7/2015 | Chen | H01L 27/11565 257/314 |
| 2015/0340369 | A1* | 11/2015 | Lue | H01L 29/66666 365/185.17 |
| 2015/0340371 | A1* | 11/2015 | Lue | H01L 29/66 257/324 |
| 2016/0064498 | A1* | 3/2016 | Liu | H01L 27/11582 438/587 |
| 2016/0099254 | A1* | 4/2016 | Park | H01L 27/11565 257/324 |
| 2016/0126252 | A1* | 5/2016 | Tsuda | H01L 21/02164 438/269 |
| 2017/0221921 | A1* | 8/2017 | Kanamori | H01L 29/42344 |
| 2017/0229475 | A1* | 8/2017 | Yasuda | H01L 21/02164 |
| 2018/0114794 | A1* | 4/2018 | Jang | H01L 29/40117 |
| 2019/0244971 | A1* | 8/2019 | Harari | H01L 23/53257 |
| 2020/0091180 | A1* | 3/2020 | Seki | H01L 29/40117 |
| 2020/0258897 | A1 | 8/2020 | Yan et al. | |
| 2020/0286875 | A1 | 9/2020 | Nishida et al. | |
| 2020/0295043 | A1 | 9/2020 | Nishida et al. | |
| 2020/0365611 | A1 | 11/2020 | Chiu | |
| 2020/0381450 | A1* | 12/2020 | Lue | H01L 29/792 |
| 2020/0402996 | A1* | 12/2020 | Cheon | H01L 27/11575 |
| 2021/0225863 | A1* | 7/2021 | Wu | H01L 27/1157 |
| 2021/0408034 | A1* | 12/2021 | Lee | H01L 27/11573 |
| 2021/0408036 | A1* | 12/2021 | Lee | H01L 27/11519 |
| 2022/0037305 | A1* | 2/2022 | Lee | G11C 16/08 |
| 2022/0068957 | A1* | 3/2022 | Yeh | H01L 27/11565 |

* cited by examiner

SEMICONDUCTOR DEVICE AND METHOD FOR FABRICATING THE SAME

BACKGROUND OF THE INVENTION

Field of the Invention

The invention relates in general to a semiconductor device and a method for fabricating the same, and more particularly to a three-dimensional semiconductor device and a method for fabricating the same.

Description of the Related Art

Recently, as the demand for more excellent memory devices has gradually increased, various three-dimensional (3D) memory devices have been provided. However, in order for such three-dimensional memory devices to achieve higher storage capacity and higher performance, there is still a need to provide an improved three-dimensional memory device and a method for fabricating the same.

SUMMARY OF THE INVENTION

The present invention relates to a semiconductor device. Compared with the comparative example in which the channel layer is arranged outside the first conductive pillar and the second conductive pillar and surrounds the first conductive pillar and the second conductive pillar, since the channel layer of the semiconductor device of the present invention is disposed between the first conductive pillar and the second conductive pillars, it can have a shorter channel length, which not only improves the performance of the semiconductor device, but also increases the density of the chip.

According to an embodiment of the present invention, a semiconductor device is provided. The semiconductor device includes a stack and a plurality of memory strings. The stack is formed on a substrate, and the stack includes a plurality of conductive layers and a plurality of insulating layers alternately stacked. The memory strings penetrate along a first direction, and each of the memory strings includes a first conductive pillar and a second conductive pillar, a channel layer, and a memory structure. The first conductive pillar and the second conductive pillar respectively extend along the first direction and are electrically isolated from each other. The channel layer extends along the first direction, wherein the channel layer is disposed between the first conductive pillar and the second conductive pillar, and the channel layer is coupled to the first conductive pillar and the second conductive pillar. The memory structure surrounds the first conductive pillar, the second conductive pillar and the channel layer.

According to another embodiment of the present invention, a semiconductor device is provided. The semiconductor device includes a stack and a plurality of memory strings. The stack is formed on a substrate, and the stack includes a plurality of conductive layers and a plurality of insulating layers alternately stacked. The memory strings penetrate the stack along a first direction, and each of the memory strings includes a first conductive pillar and a second conductive pillar, a channel layer, and a memory structure. The first conductive pillar and the second conductive pillar respectively extend along the first direction and are electrically isolated from each other. The channel layer extends along the first direction, wherein the channel layer is coupled to the first conductive pillar and the second conductive pillar. The memory structure surrounds the first conductive pillar, the second conductive pillar and the channel layer. The conductive layer includes a first bottom conductive layer, and the first bottom conductive layer is disposed under the first conductive pillar and the second conductive pillar.

According to yet another embodiment of the present invention, a method for fabricating a semiconductor device is provided. The method includes the following steps. First, a stack is formed on a substrate. The stack includes a plurality of conductive layers and a plurality of insulating layers alternately stacked. After that, a plurality of memory strings are formed. The memory strings penetrate the stack along a first direction, and each of the memory strings includes a first conductive pillar and a second conductive pillar, a channel layer, and a memory structure. The first conductive pillar and the second conductive pillar respectively extend along the first direction and are electrically isolated from each other. The channel layer extends along the first direction, wherein the channel layer is disposed between the first conductive pillar and the second conductive pillar, and the channel layer is coupled to the first conductive pillar and the second conductive pillar. The memory structure surrounds the first conductive pillar, the second conductive pillar and the channel layer.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1A:
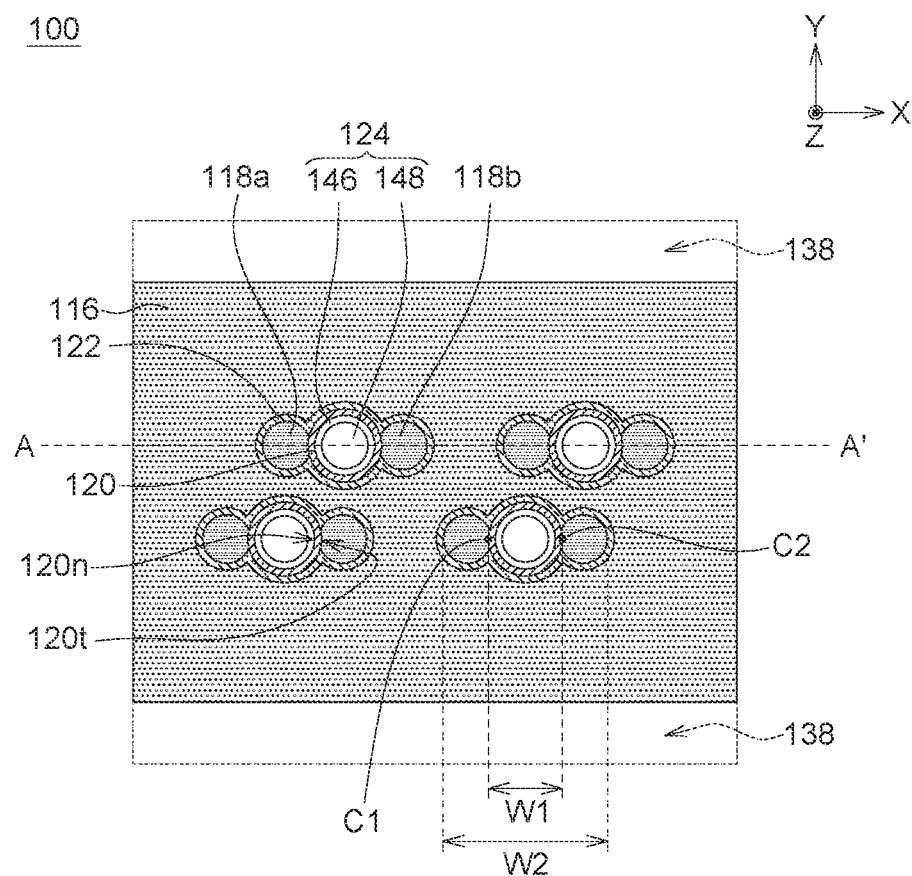
FIG. 1A shows a top view of a semiconductor device according to an embodiment of the invention.
Figure 1B:
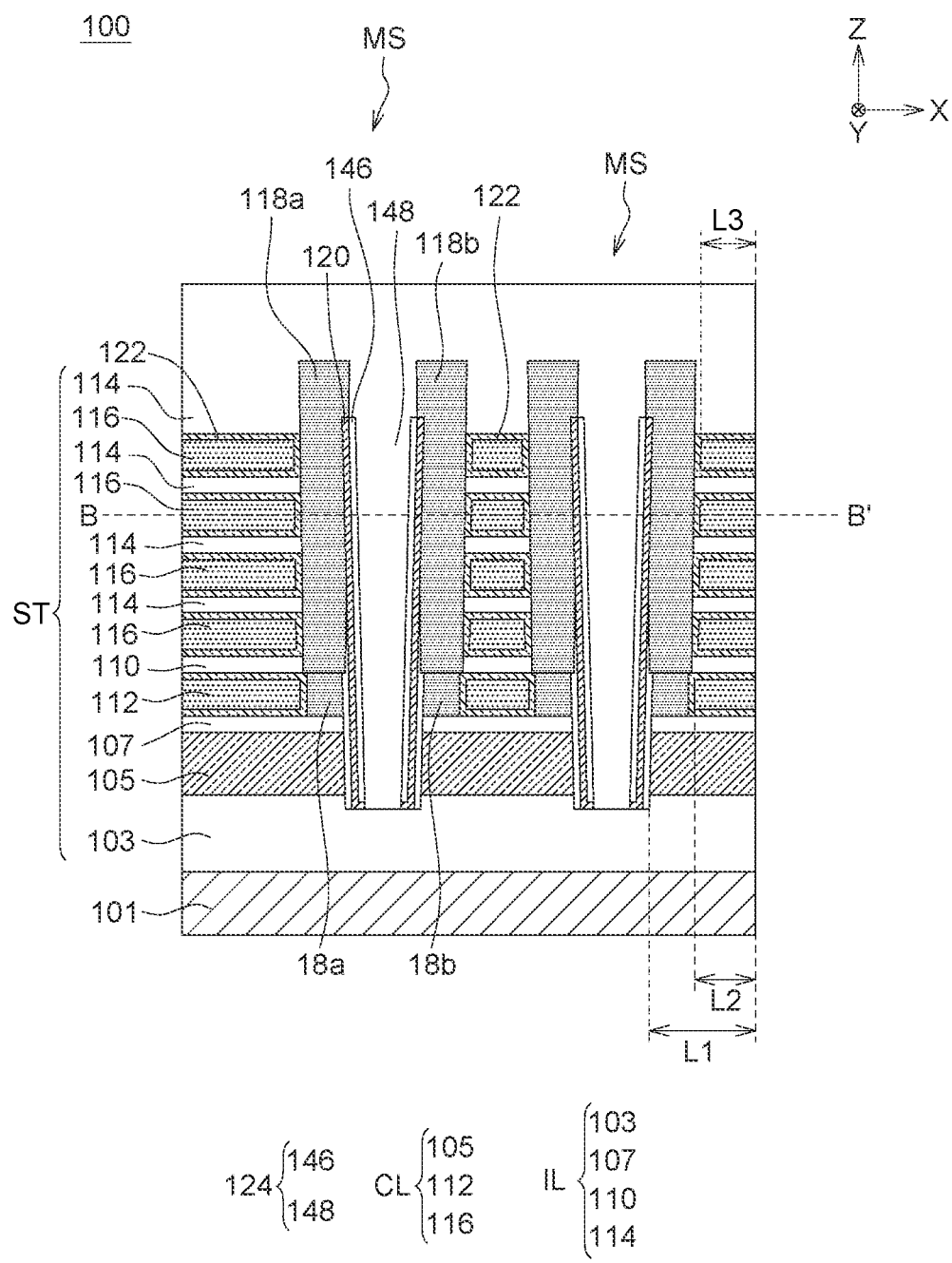
FIG. 1B shows a cross-sectional view taken along the line A-A' of FIG. 1A.

FIG. 1A shows a top view of a semiconductor device 100 according to an embodiment of the present invention, corresponding to the plane of the B-B' connecting line of FIG. 1B (that is, corresponding to the plane formed by the X-axis and Y-axis). FIG. 1B is a cross-sectional view taken along the line A-A' of FIG. 1A (that is, corresponding to the plane formed by the X-axis and the Z-axis). In the present embodiment, the X-axis, the Y-axis and the Z-axis are perpendicular to each other, but the present invention is not limited thereto, as long as the X-axis, the Y-axis and the Z-axis are intersected to each other.

Referring to FIGS. 1A and 1B at the same time, the semiconductor device 100 includes a stack ST and a plurality of memory strings MS. Trenches 138 can divide the stack ST into multiple sub-stacks (not shown). The semiconductor device 100 is formed on a substrate 101. The stack ST includes a plurality of conductive layers CL and a plurality of insulating layers IL alternately stacked. The memory strings MS penetrate the stack ST along a first direction, respectively. The first direction is, for example, the direction of the Z-axis. In detail, the conductive layers CL include a first bottom conductive layer 105, a second bottom conductive layer 112, and a plurality of upper conductive layers 116 sequentially stacked on the substrate 101. The insulating layers IL include a first bottom insulating layer 103, a second bottom insulating layer 107, a third bottom insulating layer 110, and a plurality of upper insulating layers 114 sequentially stacked on the substrate 101.

Each of the memory strings MS includes a first conductive pillar 118a and a second conductive pillar 118b, a channel layer 120, an insulating pillar 124, and a memory structure 122. The insulating pillar 124 may include a second oxide layer 146 and an oxide material 148. The first conductive pillar 118a and the second conductive pillar 118b respectively extend along the first direction and are electrically isolated from each other. The channel layer 120 and the insulating pillar 124 extend along the first direction, and penetrate the first bottom conductive layer 105, the second bottom insulating layer 107, the second bottom conductive layer 112, the third bottom insulating layer 110, and the other layers of the stack ST. The channel layer 120 is disposed between the first conductive pillar 118a and the second conductive pillar 118b as shown in FIG. 1A. In FIG. 1B, the channel layer 120 extends between the insulating pillar 124 and the first conductive pillar 118a, and between the insulating pillar 124 and the second conductive pillar 118b. The channel layer 120 is coupled to the first conductive pillar 118a and the second conductive pillar 118b. In addition, the channel layer 120 has an annular cross section formed along a second direction (for example, the X-axis direction) and a third direction (for example, the Y-axis direction), as shown in FIG. 1A. The second direction and the third direction are, for example, perpendicular to the first direction (but the invention is not limited to this). In detail, the channel layer 120 has an annular inner surface 120n and an annular outer surface 120t, and the first conductive pillar 118a and the second conductive pillar 118b are coupled to the annular outer surface 120t. The insulating pillar 124 is connected to the annular inner surface 120n of the channel layer 120. In other words, the first conductive pillar 118a and the second conductive pillar 118b are disposed on the outer side of the channel layer 120, and are not disposed on the inner side of the channel layer 120. In the present embodiment, the cross section of the channel layer 120 is circular, but the present invention is not limited to this, and the cross section of the channel layer 120 may be an ellipse or other suitable shapes.

In FIG. 1A, the first conductive pillar 118a is coupled to the first position C1 of the channel layer 120, and the second conductive pillar 118b is coupled to the second position C2 of the channel layer 120. For example, the first position C1 and the second position C2 are opposite to each other along the second direction. On the extension line between the first position C1 and the second position C2 (for example, passing through the center point of the insulating pillar 124), the channel layer 120 forms a first width W1 (for example, the maximum width). A width formed from the first conductive pillar 118a, to the second conductive pillar 118b is a second width W2 (for example, the maximum width). The second width W2 is greater than the first width W1. In some embodiments, the first width W1 formed by the channel layer 120 may be referred to as a channel length. Compared with the comparative example in which the channel layer surrounds the first conductive pillar and the second conductive pillar, since the channel layer 120 in the embodiment of the present invention is disposed between the first conductive pillar 118a and the second conductive pillar 118b, the volume occupied by the channel layer 120 is smaller, and the channel length can be shorter, so the density of the chip can be increased, and the semiconductor device can achieve better performance. The first conductive pillar 118a and the second conductive pillar 118a contact the channel layer 120 to form two contact areas, respectively. The size of the contact areas can be adjusted according to requirements. In some embodiments, the first conductive pillar 118a, the channel layer 120 and the second conductive pillar 118b are arranged along the second direction. In FIG. 1A, the first conductive pillar 118a, and the second conductive pillar 118b contact the channel layer 120 at opposite sides along the second direction.

In FIG. 1B, The first bottom conductive layer 105 is disposed under the first conductive pillar 118a and the second conductive pillar 118b, and the first bottom conductive layer 105 surrounds a bottom portion of the channel layer 120. The conductive layers CL disposed above the first bottom conductive layer 105 (that is, the second bottom conductive layer 112 and the upper conductive layers 116) surround the first conductive pillar 118a and the second conductive pillar 118b. In the first direction, the first bottom conductive layer 105 overlaps the first conductive pillar 118a and the second conductive pillar 118b. The first bottom conductive layer 105 surrounds the bottom of the channel layer 120. In the second direction, a length L1 of the first bottom conductive layer 105 is greater than a length L2 of the second bottom conductive layer 112 disposed above the first bottom conductive layer 105. In the second direction, a length L1 of the first bottom conductive layer 105 is greater than a length L3 of the upper conductive layer 116. The first bottom insulating layer 103 is disposed between the substrate 101 and the first bottom conductive layer 105. The second bottom insulating layer 107 is disposed between the first bottom conductive layer 105 and the first conductive pillar 118a, and between the first bottom conductive layer 105 and the second conductive pillar 118b. In FIG. 1B, a bottom structure 18a of the first conductive pillar 118a has a bottom surface substantially coplanar with a bottom surface of the second bottom conductive layer 112.

The memory structure 122 surrounds a portion of the first conductive pillar 118a, a portion of the second conductive pillar 118b, and a portion of the channel layer 120 in FIG. 1A. In the cross section of the second direction and the third direction, the memory structure 122 is conformal to the first conductive pillar 118a, the second conductive pillar 118b and the channel layer 120, as shown in FIG. 1A. In FIG. 1B, a portion of the memory structure 122 extends along the first direction (for example, the Z direction), and a portion of the memory structure 122 extends along the second direction (for example, the X direction), so that the memory structure 122 surrounds the second bottom conductive layer 112 and upper conductive layers 116. The insulating pillar 124 is disposed in the central area of the memory string MS. The channel layer 120 surrounds the insulating pillar 124, that is, the channel layer 120 extends along the first direction between the insulating pillar 124 and the first conductive pillar 118a, and between the insulating pillar 124 and the second conductive pillar 118b.

In some embodiments, the substrate 101 is, for example, a dielectric layer (for example, a silicon oxide layer). For example, the insulating layers IL may be a silicon oxide layer, and the silicon oxide layer may include silicon dioxide, for example. The material of the insulating pillar 124 is, for example, an oxide. The insulating pillar 124 may include a second oxide layer 146 and an oxide material 148. The materials of the second oxide layer 146 and the oxide material 148 may be the same as each other, for example, both are silicon dioxide. The conductive layers CL may be formed of conductive materials, such as polysilicon, amorphous silicon, tungsten (W), cobalt (Co), aluminum (Al), tungsten silicide ($WSi_x$), cobalt silicide ($CoSi_x$) or other suitable materials. In the present embodiment, the material of the first bottom conductive layer 105 is different from the material of the conductive layers CL (that is, the second bottom conductive layer 112 and the upper conductive layer 116) disposed above the first bottom conductive layer 105. For example, the material of a bottom conductive layer 105 is P-type doped polysilicon, and the material of the second bottom conductive layer 112 and the upper conductive layers 116 is tungsten, but the present invention is not limited thereto. In some embodiments, the material of the first bottom conductive layer 105 may be the same as the materials of the second bottom conductive layer 112 and the upper conductive layer 116.

In the present embodiment, the memory structure 122 includes a charge storage material, such as a charge storage material formed of an oxide layer, a nitride layer, and an oxide layer, but the invention is not limited thereto. The material of the channel layer 120 is, for example, undoped polysilicon, but the invention is not limited thereto. The material of the first conductive pillar 118a and the second conductive pillar 118b is, for example, N-type doped polysilicon, but the invention is not limited thereto.

In the present embodiment, only 7 insulating layers IL and 6 conductive layers CL are exemplarily shown, but the present invention is not limited to this. The number of insulating layers IL can be greater than 7, and the number of conductive layers CL can be greater than 6, and the number and configuration of the insulating layers IL and the conductive layers CL can be adjusted as required.

As shown in FIG. 1B, in some embodiments, the intersection between the first conductive pillar 118a, the second conductive pillar 118b, the conductive layers 120 and each of the memory structures 122 and the upper conductive layers 116 may form a memory cell, and a plurality of the memory cells are disposed along the first direction to form a memory string MS. The upper conductive layers 116 can be used as a gate, and the first conductive pillar 118a and the second conductive pillar 118b can be a source or a drain.

In the present embodiment, there may be residual oxide between a bottom structure 18a of the first conductive pillar 118a and the channel layer 120 and between a bottom structure 18b of the second conductive pillar 118b and the channel layer 120. The second bottom conductive layer 112 may serve as a dummy gate. In addition, a voltage of 0 V or smaller than 0 V (such as a negative voltage) can be applied to the second bottom conductive layer 112 to prevent leakage current. However, the present invention is not limited thereto. In some embodiments, there may be no oxide between the first conductive pillar 118a and the channel layer 120 and between the second conductive pillar 118b and the channel layer 120.

In some embodiments, the first bottom conductive layer 105 can be used as a dummy gate, and a voltage of 0V or smaller than 0 V (such as a negative voltage) can be applied to the first bottom conductive layer 105 to prevent leakage current from the channel layer 120.

In some embodiments, the semiconductor device 100 of the present invention can be applied to three-dimensional AND flash memory (3D AND flash memory), three-dimensional NOR memory (3D NOR memory) or other suitable memory.

FIGS. 2A to 12B are schematic diagrams illustrating the manufacturing process of the semiconductor device 100 according to an embodiment of the present invention. FIGS. 2A, 3A, 4A, 5A, 6A, 7A, 8A, 9A, 10A, 11A, and 12A show the plane formed by the X-axis and Y-axis. FIGS. 2B, 3B, 4B, 5B, 6B, 7B, 8B, 9B, 10B, 11B and 12B show the plane formed by the X-axis and the Z-axis. In detail, FIGS. 2A, 3A, 4A, 5A, 6A, 7A, 8A, 9A, 10A, 11A, and 12A correspond to planes taken along line B-B' of FIGS. 2B, 3B, 4B, 5B, 6B, 7B, 8B, 9B, 10B, 11B and 12B, respectively. FIGS. 2B, 3B, 4B, 5B, 6B, 7B, 8B, 9B, 10B, 11B, and 12B show cross-sectional views taken along line A-A' of FIGS. 2A, 3A, 4A, 5A, 6A, 7A, 8A, 9A, 10A, 11A, and 12A, respectively.

Figure 2A:
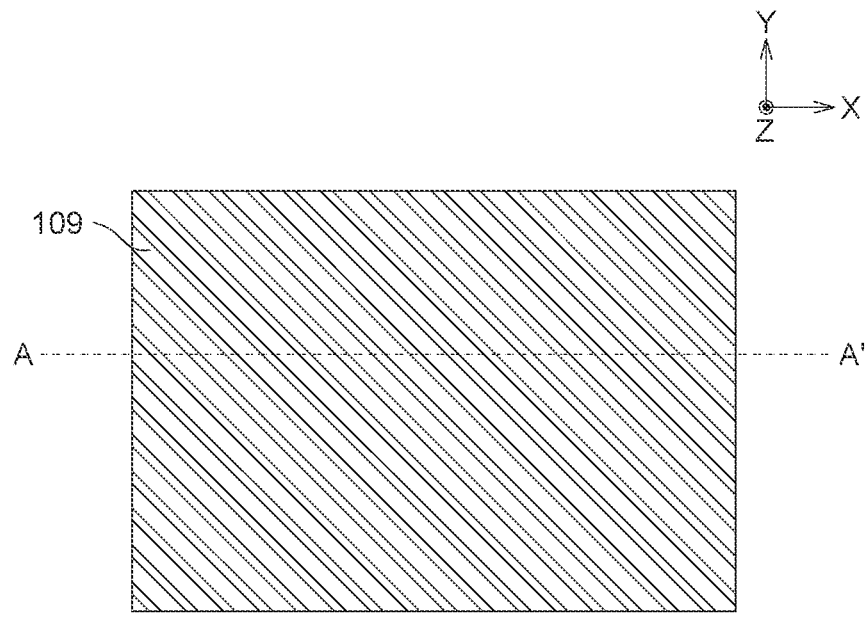
FIGS. 2A to 12B are schematic diagrams illustrating the manufacturing process of a semiconductor device according to an embodiment of the invention.
Figure 2B:
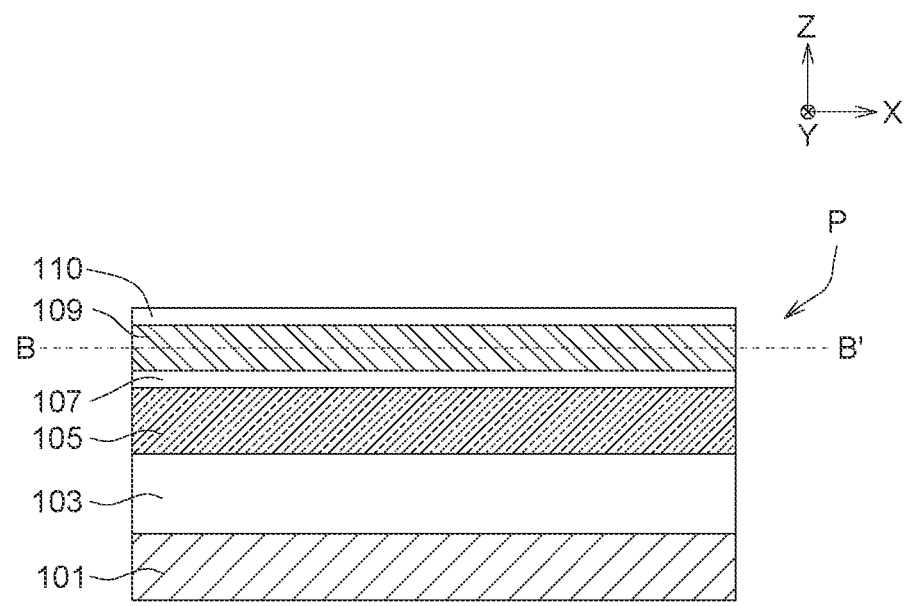

FIG. 2A shows the top view after the initial structure P is formed, corresponding to the plane taken along line B-B' of FIG. 2B.

Referring to FIGS. 2A and 2B at the same time, a substrate 101 is provided, and a first bottom insulating layer 103, a first bottom conductive layer 105, and a second bottom insulating layer 107, a bottom sacrificial layer 109, and a third bottom insulating layer 110 are sequentially formed on the substrate 101 by a deposition process, to form an initial structure P. The deposition process is, for example, a chemical vapor deposition process.

Figure 3A:
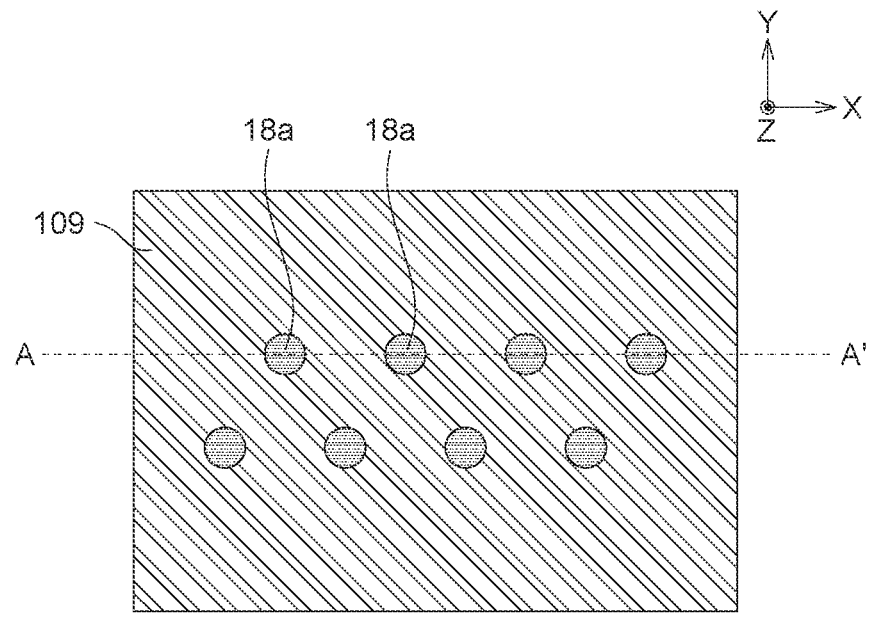
Figure 3B:
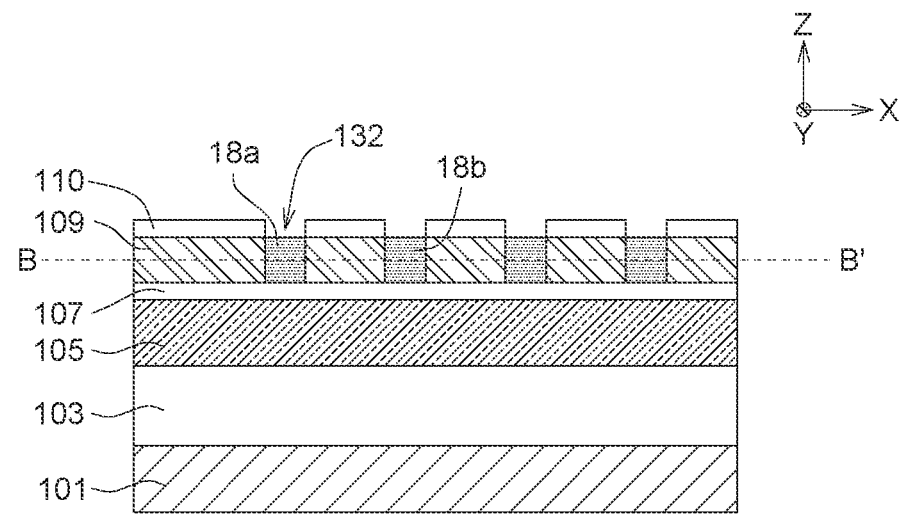

Referring to FIGS. 3A and 3B, a plurality of first openings 132 penetrating the third bottom insulating layer 110 and the bottom sacrificial layer 109 along the first direction (such as the Z direction) are formed by an etching process. The bottoms of each of the first openings 132 expose a portion of the upper surface of the second bottom insulating layer 107. Thereafter, a conductive material is filled in the first openings 132 by a deposition process to form a plurality of bottom structures 18a and 18b of the first conductive pillar 118a and the second conductive pillar 118b (shown in FIGS. 1A and 1B). In some embodiments, the bottom structures 18a and 18b and the bottom sacrificial layer 109 have the same thickness. The material of the bottom structures 18a and 18b is, for example, N-type doped polysilicon, but the present invention is not limited thereto. In some embodiments, after the conductive material is filled into the first openings 132, an etch-back process can be used to remove a portion of the conductive material to form the bottom structures 18a and 18b, wherein some recesses may be formed between the bottom structures 18a and 18b and the third bottom insulating layer 110.

In some embodiments, after the third bottom insulating layer 110 with recesses is removed, a third bottom insulating layer 110 can be deposited again on the bottom sacrificial layer 109 and the bottom structures 18a and 18b. In some embodiments, an insulating material may be filled in the recesses of the third bottom insulating layer 110. In some embodiments, a chemical mechanical polishing (CMP) process can be used to allow the third bottom insulating layer 110 to have a flat upper surface. However, the present invention is not limited thereto.

Figure 4A:
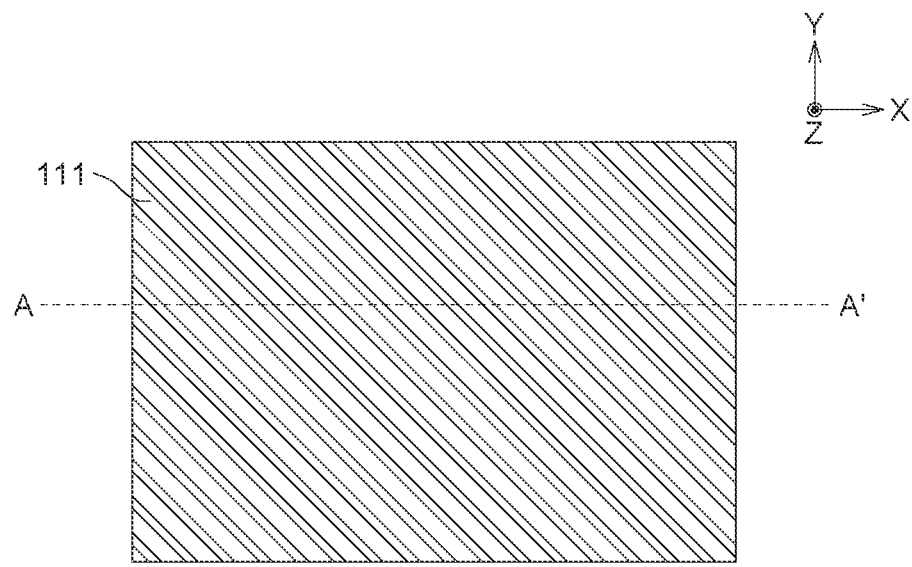
Figure 4B:
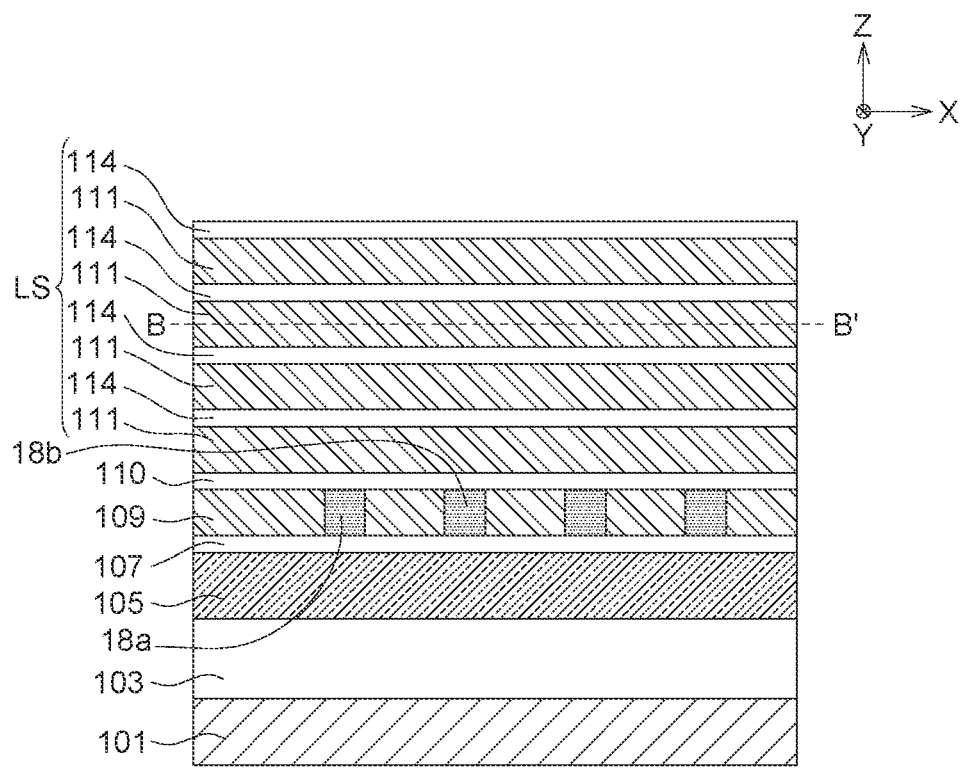

Referring to FIGS. 4A and 4B, a stacked structure LS is formed on the third bottom insulating layer 110, wherein the stacked structure LS includes a plurality of upper sacrificial layers 111 and a plurality of upper insulating layers 114 alternately stacked. The upper sacrificial layers 111 and the upper insulating layers 114 can be formed by a deposition process, respectively. In some embodiments, the material of the upper sacrificial layers 111 is nitride, such as silicon nitride; the material of the upper insulating layers 114 is oxide, such as silicon dioxide, but the invention is not limited thereto.

Figure 5A:
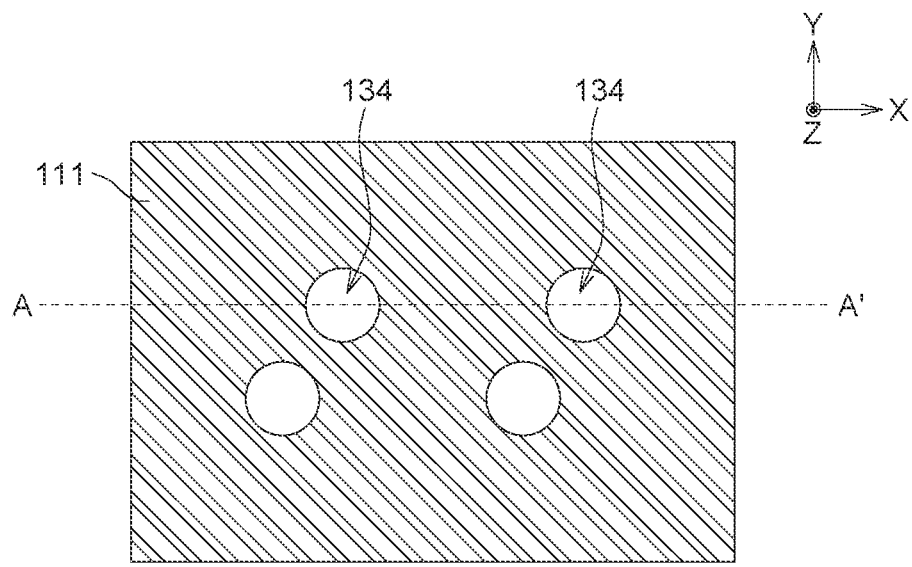
Figure 5B:
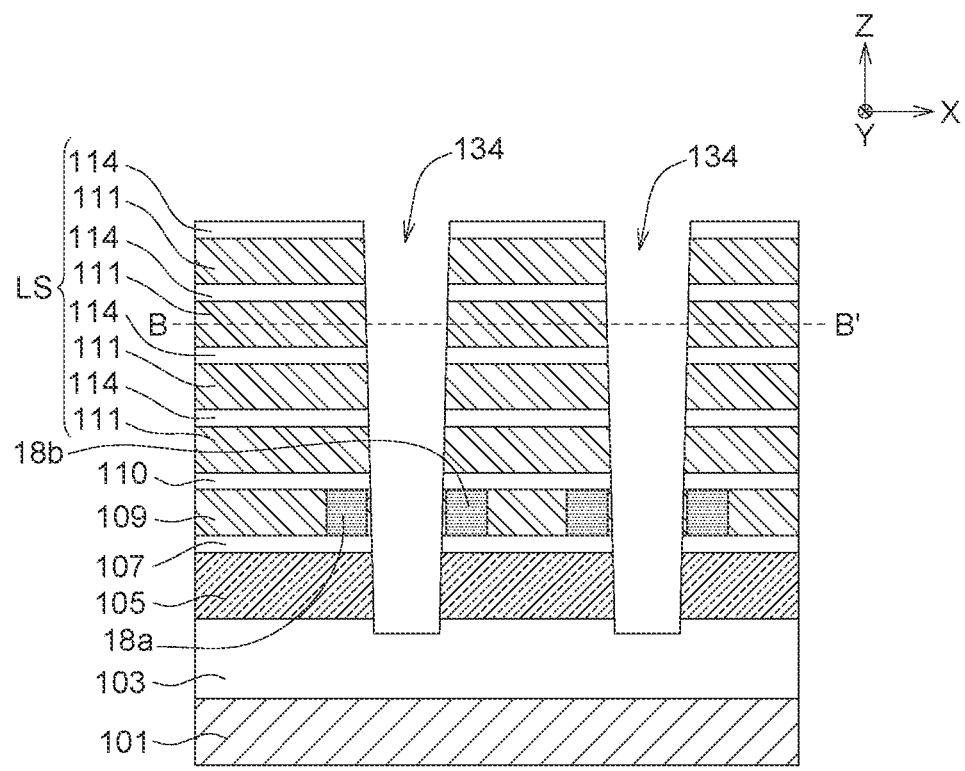

Referring to FIGS. 5A and 5B, after the step of forming the stacked structure LS, a plurality of second openings 134 are formed by an etching process (such as dry etching), wherein the second openings 134 penetrate the stacked structure LS, the third bottom insulating layer 110, the bottom sacrificial layer 109, the second bottom insulating layer 107, and the first bottom conductive layer 105. The second openings 134 are disposed between the bottom structures 18a of the first conductive pillars 118a and the bottom structure 18b of the second conductive pillar 118b. The first bottom conductive layer 105 can be used as an etching stopping layer. In some embodiments, after the first bottom conductive layer 105 is exposed through a deep etching process, a breakthrough etching step is used to penetrate the first bottom conductive layer 105 and remove a portion of the first bottom insulating layer 103, so that the bottoms of the second openings 134 are disposed in the first bottom insulating layer 103. The second openings 134 can be used to define the positions where the channel layers 120 (shown in FIGS. 6A and 6B) are formed.

Figure 6A:
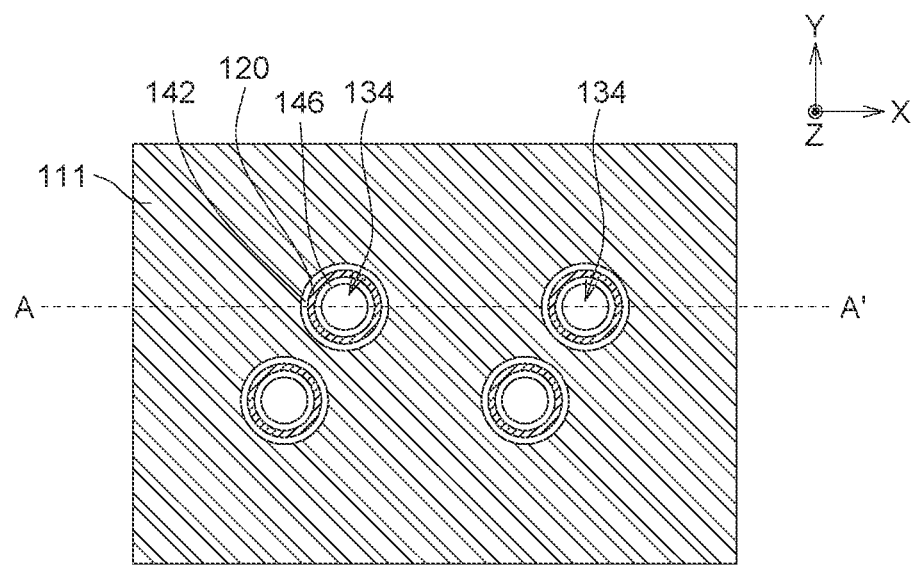
Figure 6B:
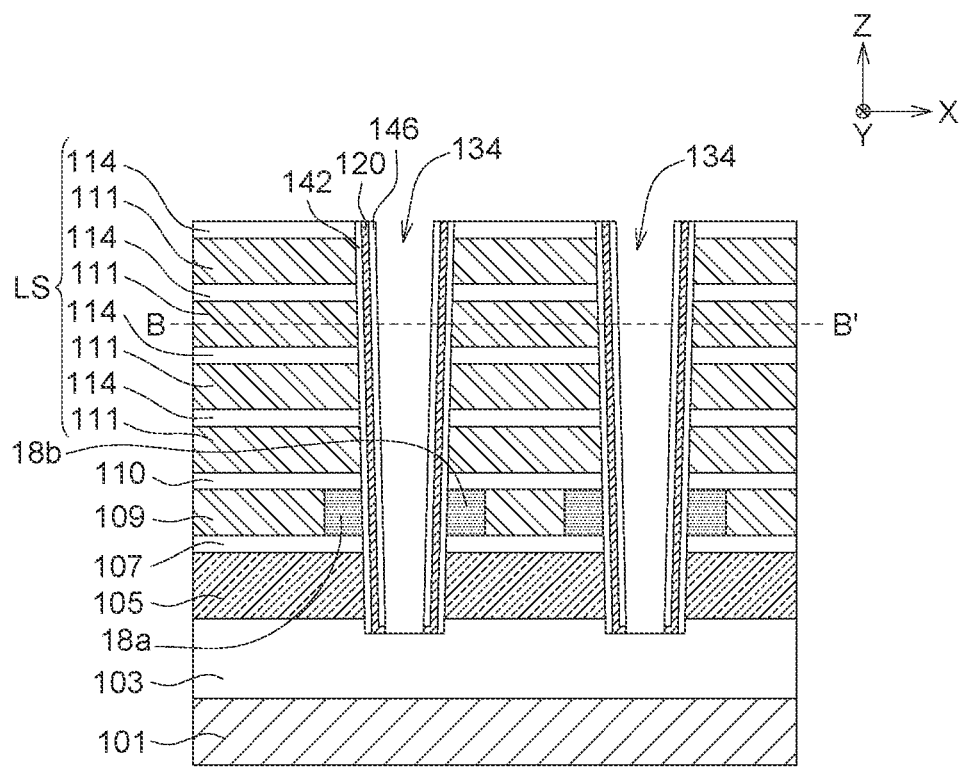

Thereafter, referring to FIGS. 6A and 6B, a first oxide layer 142, a channel layer 120, and a second oxide layer 146 are sequentially formed on sidewalls of the second openings 134. Portions of first bottom insulating layer 103 are exposed. In the present embodiment, the material of the first oxide layer 142 and the second oxide layer 146 is, for example, silicon dioxide, and the material of the channel layer 120 is, for example, undoped polysilicon, but the invention is not limited thereto.

Figure 7A:
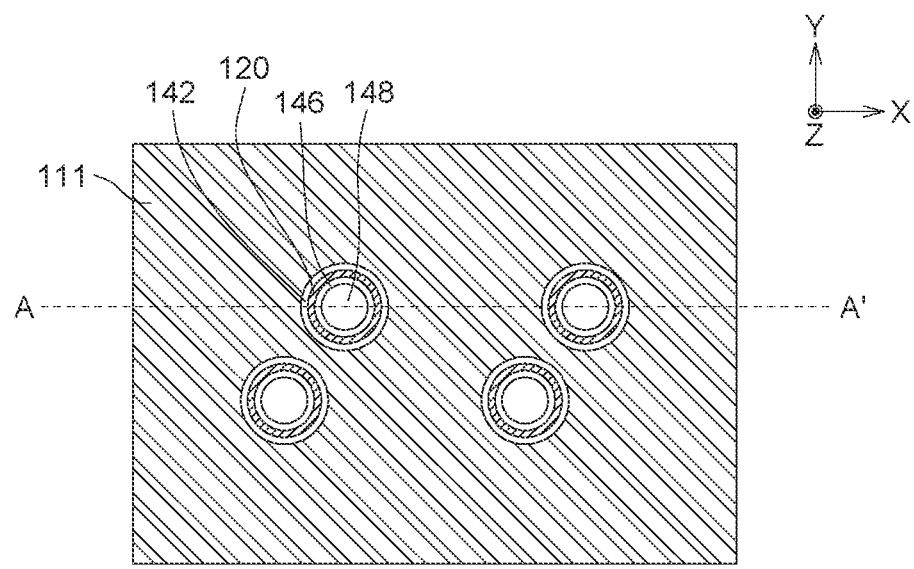
Figure 7B:
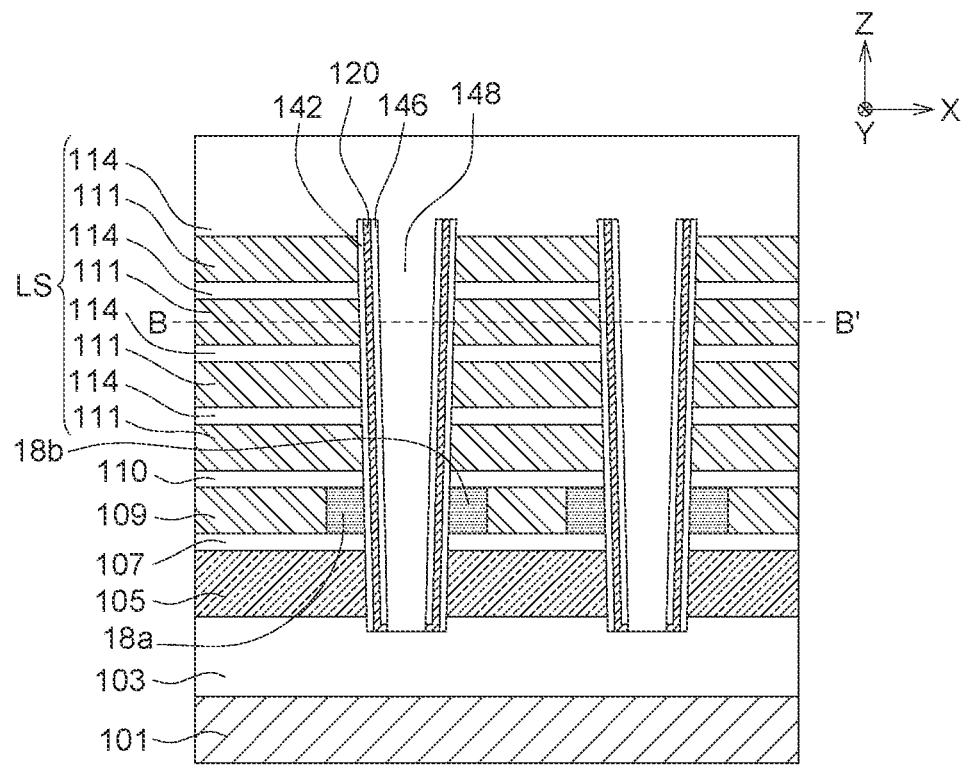

Referring to FIGS. 7A and 7B, an oxide material 148 is filled in the second openings 134 and on the stacked structure LS. For example, the material of the oxide material 148 is the same as the material of the second oxide layer 146 (such as silicon dioxide). The oxide material 148 and the second oxide layer 146 together form an insulating pillar 124, as shown in FIG. 1A.

Figure 8A:
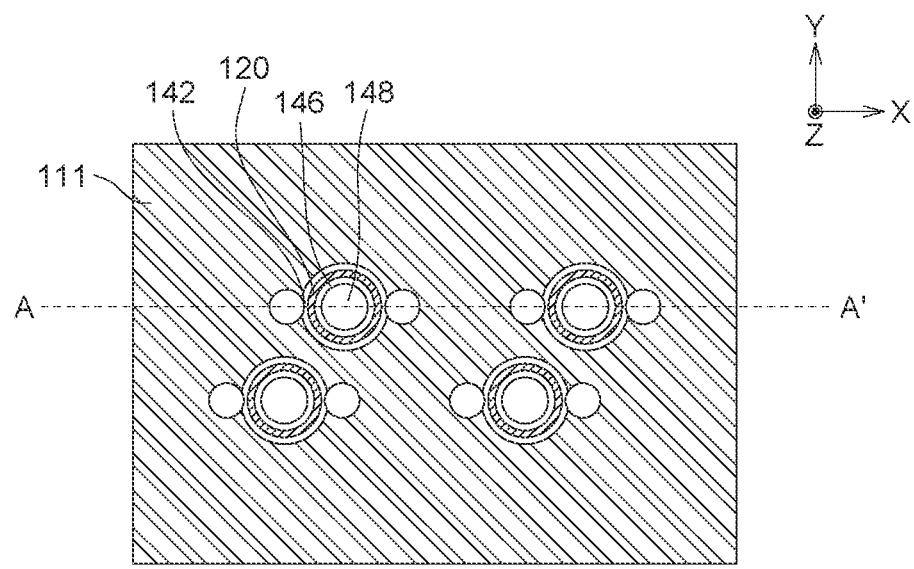
Figure 8B:
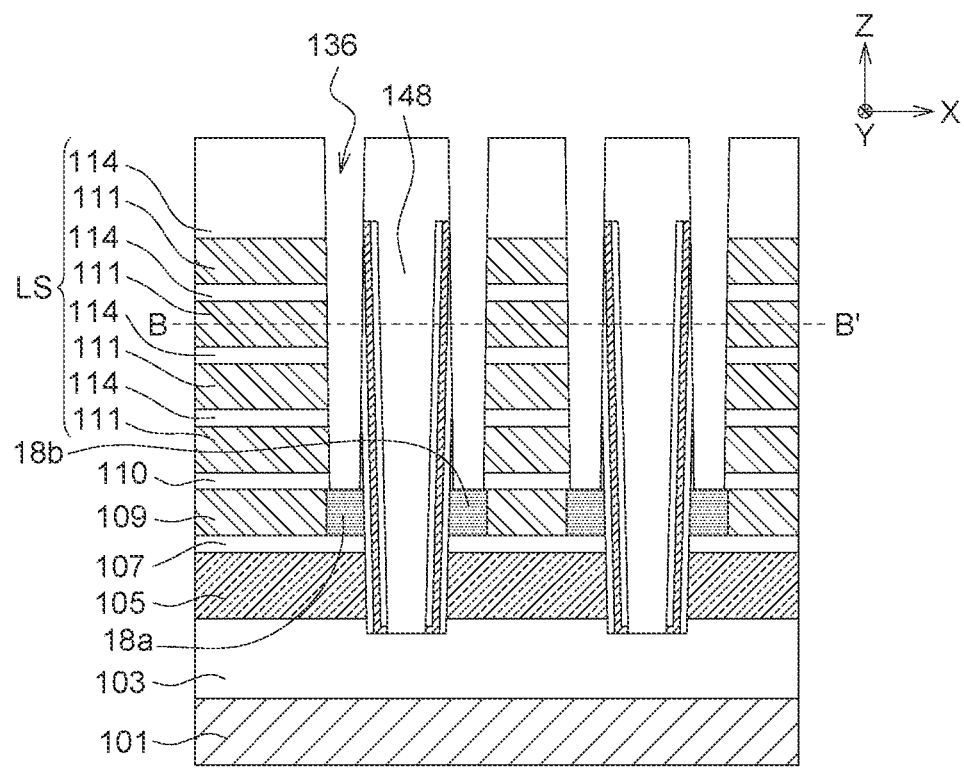

Referring to FIGS. 8A and 8B, a plurality of third openings 136 are formed penetrating the stacked structure LS and the third bottom insulating layer 110 The bottom structures 18a and 18b are exposed by the third openings 136. The bottom structures 18a and 18b can be used as etching stopping layers.

Figure 9A:
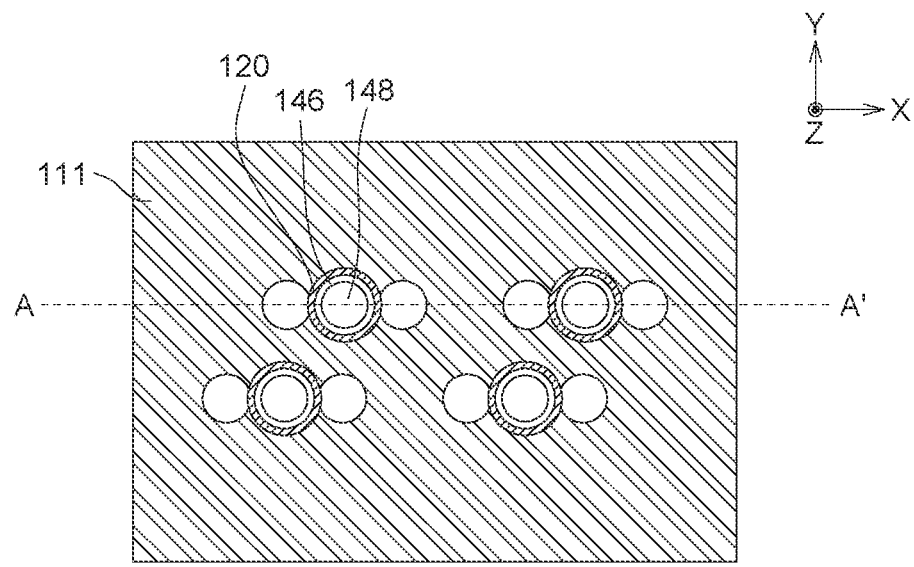
Figure 9B:
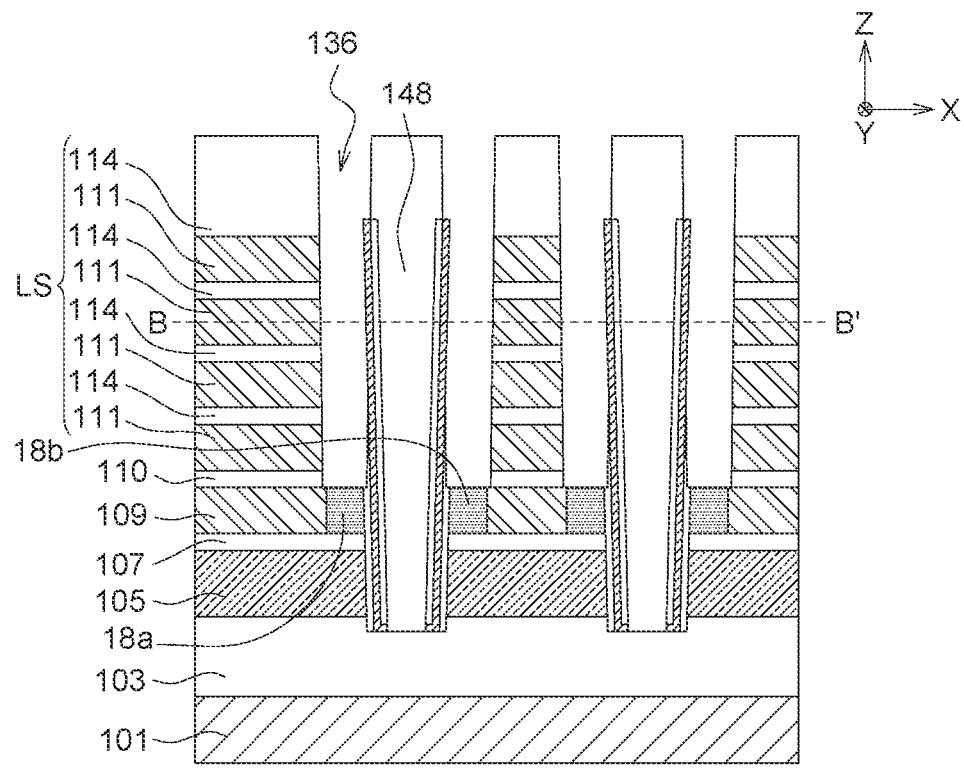

Referring to FIGS. 9A and 9B, a portion of the stacked structure LS, the third bottom insulating layer 110 are removed through the third openings 136. The first oxide layer 142 is also removed to expose the channel layer 120s above the bottom structures 18a and the bottom structures 18b.

Figure 10A:
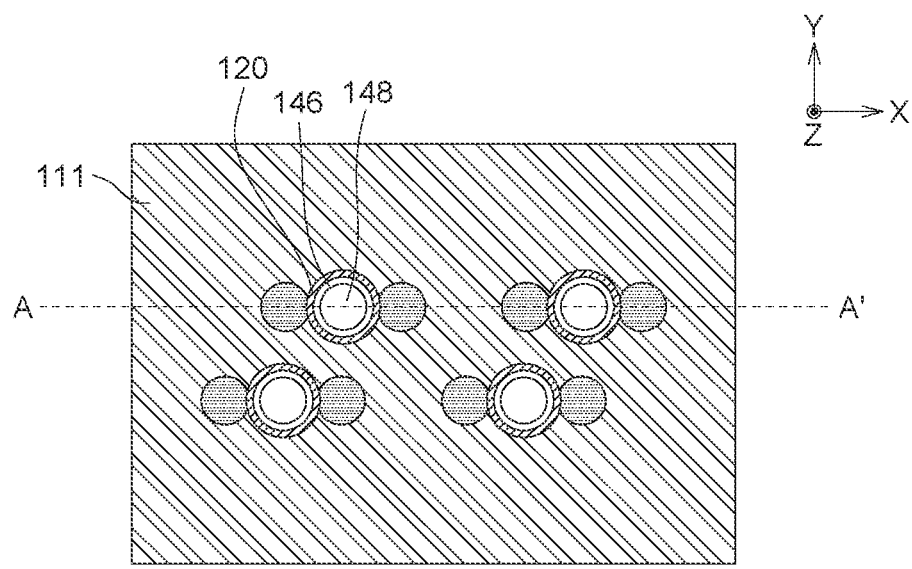
Figure 10B:
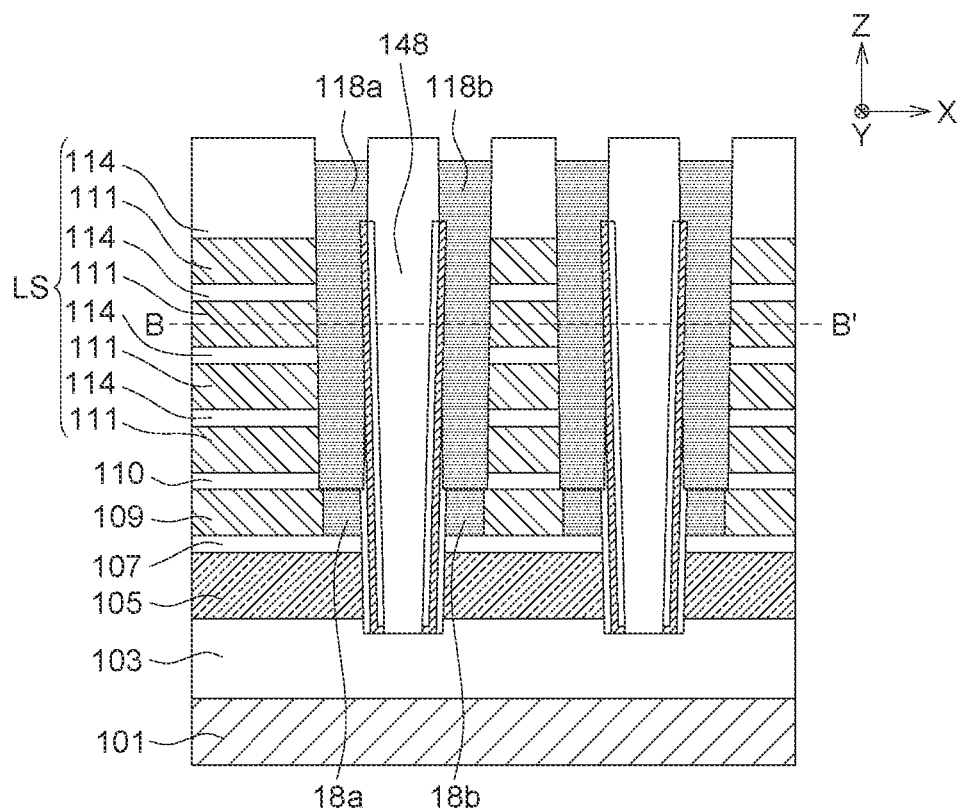

Referring to FIGS. 10A and 10B, a conductive material is filled in the third openings 136 to form first conductive pillars 118a and second conductive pillars 118b. The first conductive pillars 118a and the second conductive pillars 118b contact the bottom structures 18a and the bottom structures 18b, respectively. In the present embodiment, the material of the first conductive pillars 118a and the second conductive pillars 118b is, for example, N-type doped polysilicon, but the invention is not limited thereto.

Figure 11A:
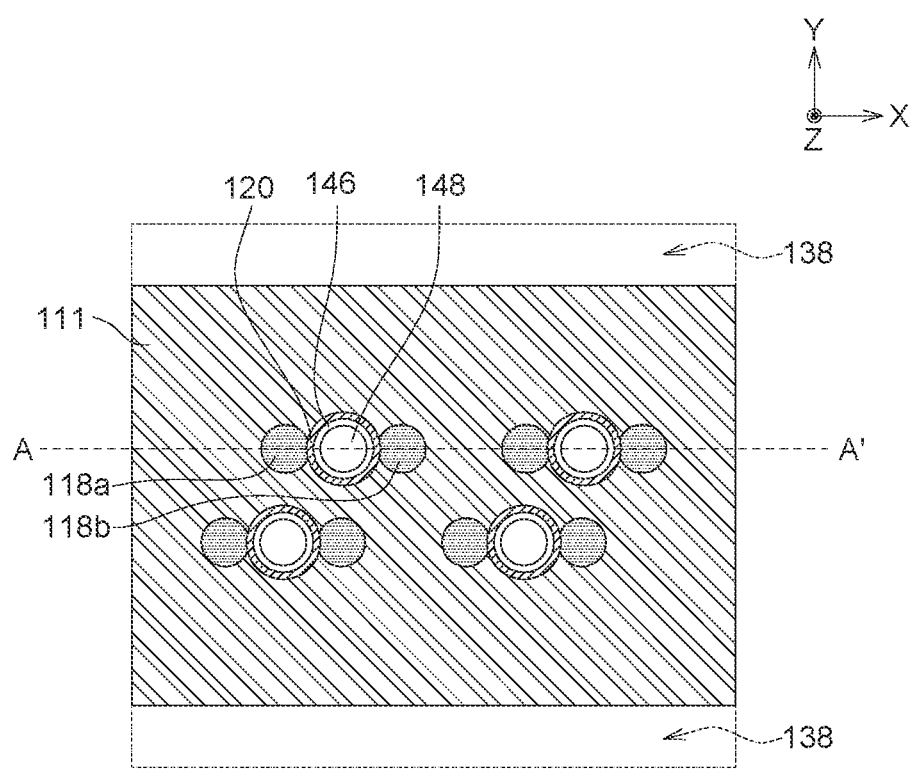
Figure 11B:
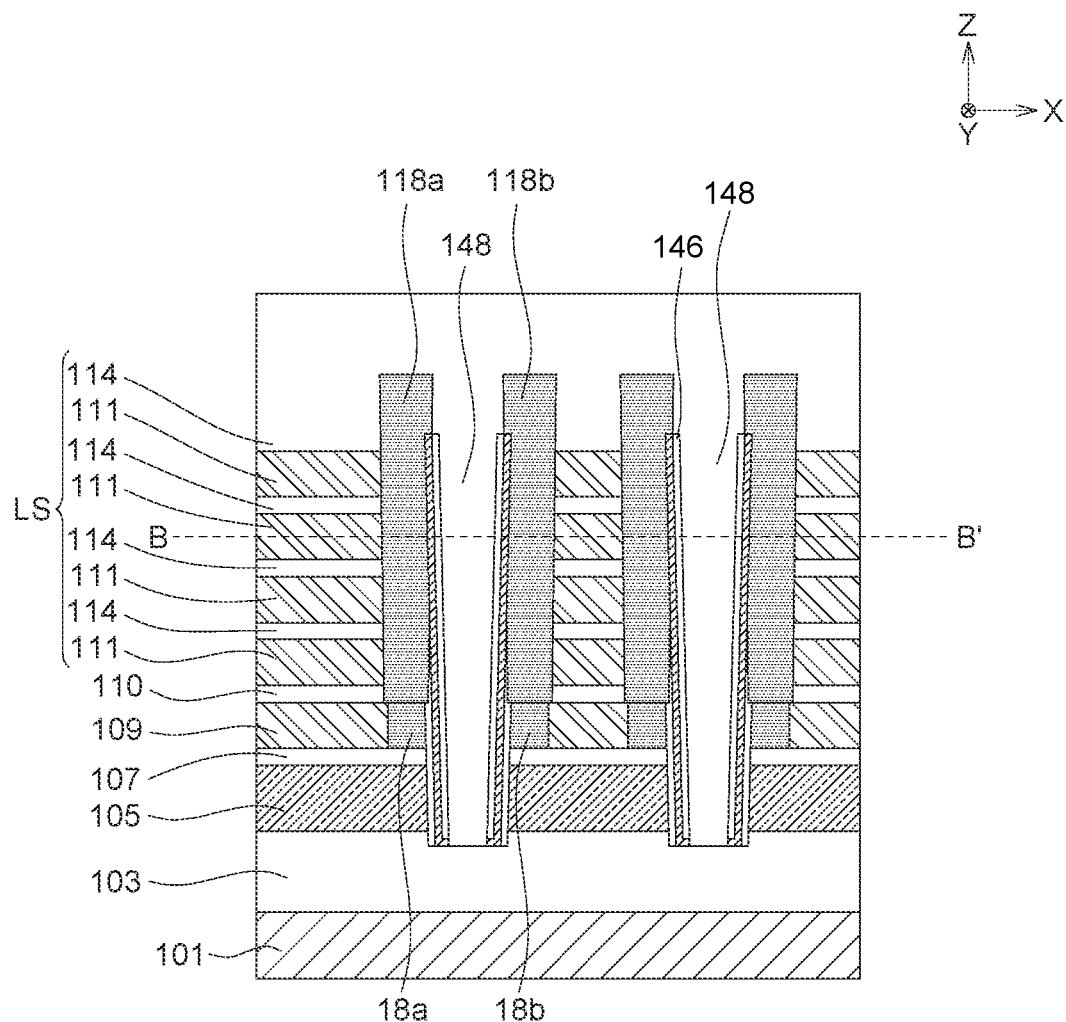

Referring to FIGS. 11A and 11B, after an insulating material is formed on the first conductive pillars 118a and the second conductive pillars 118b, a plurality of trenches 138 are formed. The trenches 138 penetrate the stacked structure LS, the third bottom insulating layer 110, the bottom sacrificial layer 112, the second bottom insulating layer 107, the first bottom conductive layer 105, and the first bottom insulating layer 103 along the first direction, and the trenches 138 extend along a second direction (for example, the X direction), and the second direction intersects the first direction (for example, perpendicular to each other). As mentioned in previous sections for FIGS. 1A and 1B, trenches 138 can divide the later formed stack ST into multiple sub-stacks (not shown). The later formed stack ST includes a plurality of conductive layers CL and a plurality of insulating layers IL alternately stacked. The memory strings MS penetrate the later formed stack ST along the first direction, respectively. The memory strings MS in FIGS. 1A and 1B is within a block or a sub-block divided by the trench 138 in a memory array.

Figure 12A:
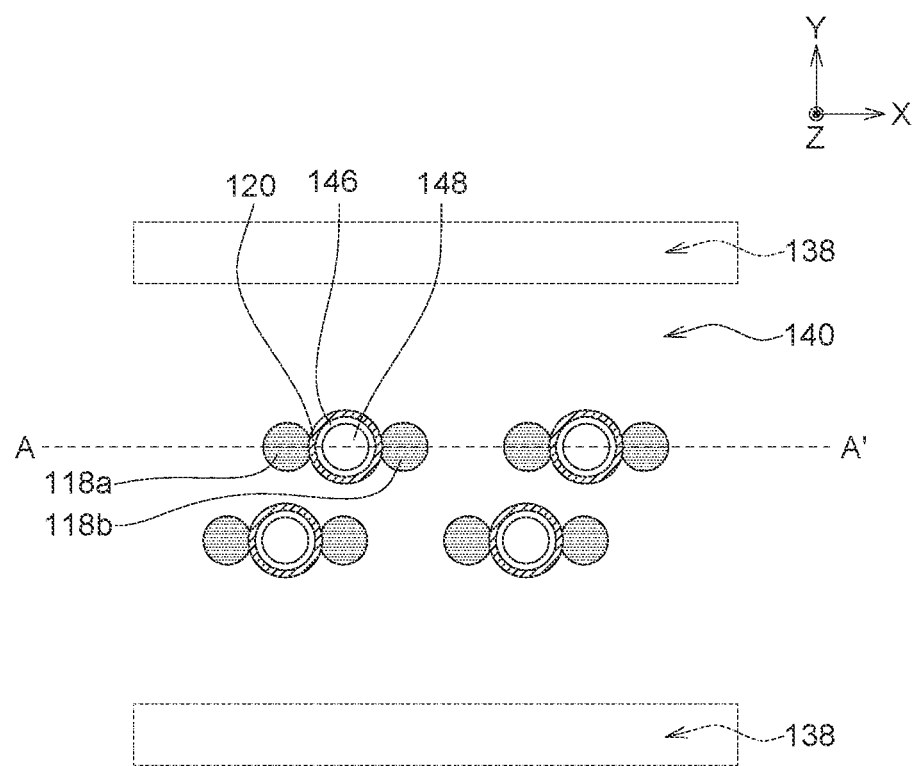
Figure 12B:
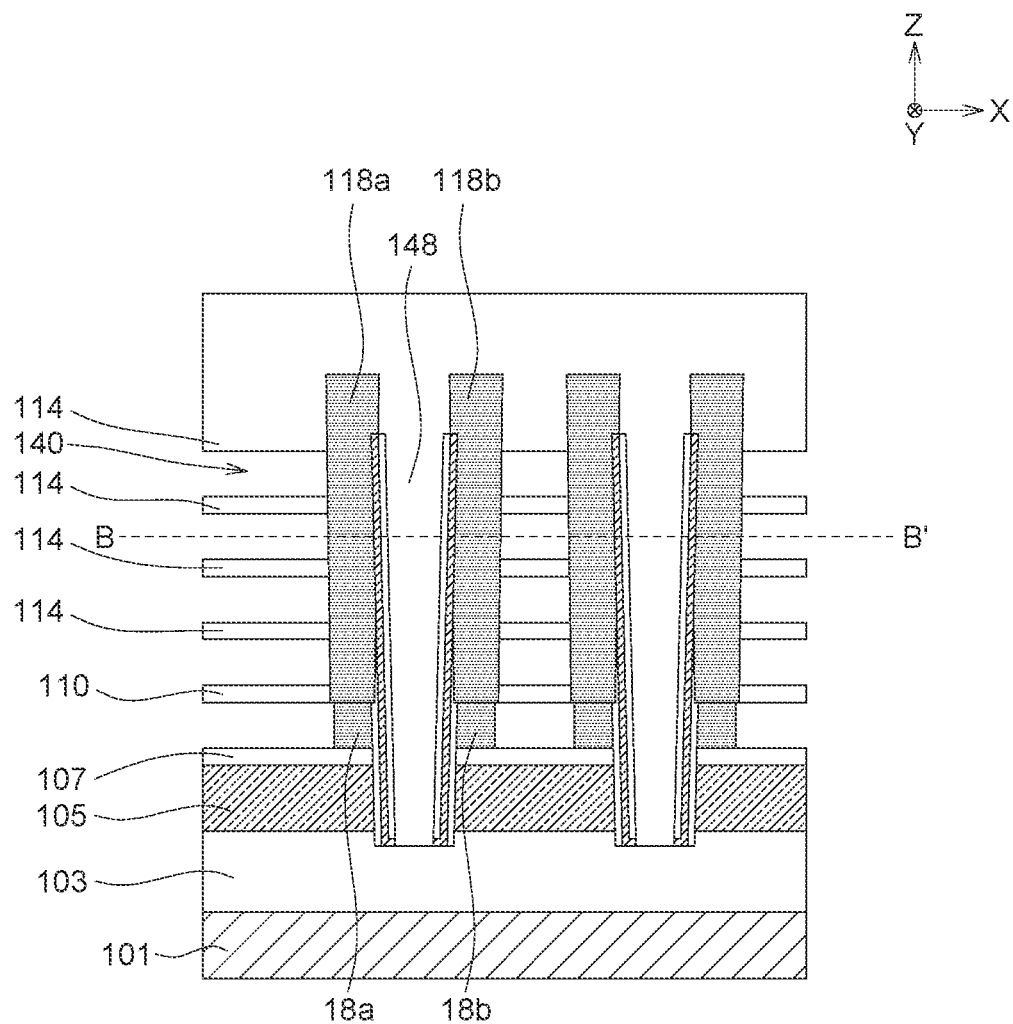

Referring to FIGS. 12A and 12B, the upper sacrificial layer 111 and the bottom sacrificial layer 109 are removed by an etching process through the trenches 138 to form a plurality of fourth openings 140 between the insulating layers IL.

Thereafter, the memory material and the conductive material are filled in the positions where the upper sacrificial layers 111 and the bottom sacrificial layer 109 are removed (that is, the fourth openings 140), to form a plurality of memory structures 122 and a plurality of upper conductive layers 116 and the second bottom conductive layer 112, respectively. The upper conductive layers 116 and the second bottom conductive layer 112 correspond to the positions where the upper sacrificial layers 111 and the bottom sacrificial layer 109 are removed, respectively. The memory structures 122 are formed on the sidewalls of the fourth openings 140. The memory structures 122 extend along the first direction and the second direction, so that the memory structures 122 surround each of the upper conductive layers 116 and the second bottom conductive layer 112, respectively, and the semiconductor device 100 shown in FIGS. 1A and 1B is formed. The memory structures 122 also surround portions of the channel layer 120 as shown in FIG. 1A.

In the subsequent manufacturing process, a plurality of input lines and a plurality of output lines (not shown) may be formed on the semiconductor device 100, and the input lines and output lines may be electrically connected to the first conductive pillars 118a and the second conductive pillars 118b, respectively.

According to an embodiment of the present invention, a semiconductor device includes a stack and a plurality of memory strings. The stack is formed on a substrate, and the stack includes a plurality of conductive layers and a plurality of insulating layers alternately stacked. The memory strings penetrate the stack along a first direction, and each of the memory strings includes a first conductive pillar and a second conductive pillar, a channel layer, and a memory structure. The first conductive pillar and the second conductive pillar extend along the first direction, respectively, and are electrically isolated from each other. The channel layer extends along the first direction, wherein the channel layer is disposed between the first conductive pillar and the second conductive pillar, and the channel layer is coupled to the first conductive pillar and the second conductive pillar. The memory structure surrounds the first conductive pillar, the second conductive pillar and the channel layer.

Compared with the comparative example in which the channel layer is disposed outside the first conductive pillar and the second conductive pillar and surrounds the first conductive pillar and the second conductive pillar, since the channel layer of the semiconductor device in the present application is disposed between the first conductive pillar and the second conductive pillar, the channel length can be greatly shortened, so the size of the memory cell can be reduced, and the memory cells can be stacked more densely. Therefore, the semiconductor device of the present invention can improve the performance of the semiconductor device on the one hand, and can increase the density of the chip on the other hand.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
   a stack formed on a substrate, the stack comprising a plurality of conductive layers and a plurality of insulating layers alternately stacked; and
   a plurality of memory strings penetrating the stack along a first direction, each of the memory strings comprises:
      a first conductive pillar and a second conductive pillar respectively extend along the first direction and are electrically isolated from each other;
      a channel layer extending along the first direction, wherein the channel layer is disposed between the first conductive pillar and the second conductive pillar, and the channel layer is coupled to the first conductive pillar and the second conductive pillar; and
      a memory structure surrounding the first conductive pillar, the second conductive pillar and the channel layer.

2. The semiconductor device according to claim 1, wherein:
   the channel layer has an annular cross section formed along a second direction and a third direction, the second direction and the third direction are perpendicular to the first direction, and the channel layer has an annular inner surface and an annular outer surface, the first conductive pillar and the second conductive pillar are coupled to the annular outer surface.

3. The semiconductor device according to claim 2, wherein each of the memory strings includes an insulating pillar located in a central area, and the insulating pillar is connected to the annular inner surface of the channel layer.

4. The semiconductor device according to claim 1, wherein each of the memory strings comprises an insulating pillar in a central area, and the channel layer extends along the first direction between the insulating pillar and the first conductive pillar, and between the insulating pillar and the second conductive pillar.

5. The semiconductor device according to claim 1, wherein the first conductive pillar is coupled to a first position of the channel layer, and the second conductive pillar is coupled to a second position of the channel layer, and the first position and the second position are opposite to each other along a second direction, and the second direction intersects the first direction,
   wherein the channel layer forms a first width, a width formed from the first conductive pillar to the second conductive pillar is a second width on an extension line between the first position and the second position, and the second width is greater than the first width.

6. The semiconductor device according to claim 1, wherein the memory structure is conformal to the channel layer, the first conductive pillar, and the second conductive pillar in a cross section in a second direction and a third direction, and the first direction, the second direction and the third direction are intersected with each other.

7. The semiconductor device according to claim 1, wherein the conductive layers comprises a first bottom conductive layer, and the first bottom conductive layer is disposed under the first conductive pillar and the second conductive pillar, and the first bottom conductive layer surrounds a bottom portion of the channel layer.

8. The semiconductor device according to claim 7, wherein a length of the first bottom conductive layer is greater than a length of the second bottom conductive layer above the first bottom conductive layer.

9. A semiconductor device, comprising:
   a stack, formed on a substrate, the stack comprising a plurality of conductive layers and a plurality of insulating layers stacked alternately; and
   a plurality of memory strings penetrate the stack along a first direction, and each of the memory strings comprises:
      a first conductive pillar and a second conductive pillar respectively extending along the first direction and electrically isolated from each other;
      a channel layer extending along the first direction, wherein the channel layer is coupled to the first conductive pillar and the second conductive pillar; and
      a memory structure surrounding the first conductive pillar, the second conductive pillar and the channel layer;
   wherein, the conductive layers comprise a first bottom conductive layer, and the first bottom conductive layer is disposed under the first conductive pillar and the second conductive pillar.

10. The semiconductor device according to claim 9, wherein the first bottom conductive layer overlaps the first conductive pillar and the second conductive pillar in the first direction.

11. The semiconductor device according to claim 9, wherein the channel layer penetrate the first bottom conductive layer.

12. The semiconductor device according to claim 9, wherein a material of the first bottom conductive layer is different from a material of the conductive layers disposed above the first bottom conductive layer.

13. The semiconductor device according to claim 9, wherein the first conductive pillar, the channel layer and the second conductive pillar are arranged along a second direction different from the first direction, and the first conductive pillar, and the second conductive pillar contact the channel layer at opposite sides along the second direction.

14. The semiconductor device according to claim 9, wherein a length of the first bottom conductive layer is greater than a length of a second bottom conductive layer disposed above the first bottom conductive layer.

15. The semiconductor device according to claim 14, wherein a bottom structure of the first conductive pillar has a bottom surface substantially coplanar with a bottom surface of the second bottom conductive layer.

16. A method for fabricating a semiconductor device, comprising:
   forming a stack disposed on a substrate, the stack comprising a plurality of conductive layers and a plurality of insulating layers stacked alternately; and
   forming a plurality of memory strings, the memory strings penetrating the stack along a first direction, and each of the memory strings comprises:
      a first conductive pillar and a second conductive pillar respectively extend along the first direction and are electrically isolated from each other;
      a channel layer extending along the first direction, wherein the channel layer is disposed between the first conductive pillar and the second conductive pillar, and the channel layer is coupled to the first conductive pillar and the second conductive pillar, and a memory structure surrounding the first conductive pillar, the second conductive pillar and the channel layer.

17. The method according to claim 16, wherein the step of forming the stack further comprises:
sequentially forming a first bottom insulating layer, a first bottom conductive layer, a second bottom insulating layer, a bottom sacrificial layer, and a third bottom insulating layer on the substrate;
forming a plurality of first openings penetrating the third bottom insulating layer and the bottom sacrificial layer;
filling a conductive material into the first openings to form a plurality of bottom structures of the first conductive pillar and the second conductive pillar, wherein the first bottom conductive layer is disposed under the first conductive pillar and the second conductive pillar; and
forming a laminated structure on the third bottom insulating layer, wherein the laminated structure comprises a plurality of upper sacrificial layers and a plurality of upper insulating layers alternately stacked.

18. The method according to claim 16, wherein after the step of forming the laminated structure, the method further comprises:
forming a second opening, wherein the second opening penetrates the laminated structure, the third bottom insulating layer, the bottom sacrificial layer, the second bottom insulating layer, and the first bottom conductive layer, and the second opening is disposed between the bottom structure of the first conductive pillar and the bottom structure of the second conductive pillar;
sequentially forming a first oxide layer, a channel layer and a second oxide layer in the second opening; and
filling an oxide material in the second opening, wherein the oxide material in the second opening and the second oxide layer together form an insulating pillar, and the channel layer extends between the insulating pillar and the first conductive pillar, and between the insulating pillar and the second conductive pillar.

19. The method according to claim 16, wherein the first conductive pillar is coupled to a first position of the channel layer, and the second conductive pillar is coupled to a second position of the channel layer, the first position and the second position are opposite to each other along a second direction, the second direction intersects the first direction,
wherein the channel layer forms a first width, a width formed from the first conductive pillar to the second conductive pillar is a second width on an extension line between the first position and the second position, and the second width is greater than the first width.

20. The method according to claim 16, wherein the memory structure is conformal to the channel layer, the first conductive pillar and the second conductive pillar on a cross section formed along a second direction and a third direction, and the first direction, the second direction and the third direction are intersected with each other.

* * * * *